(12) United States Patent
Vellore

(10) Patent No.: US 12,134,835 B2
(45) Date of Patent: Nov. 5, 2024

(54) QUARTZ SUSCEPTOR FOR ACCURATE NON-CONTACT TEMPERATURE MEASUREMENT

(71) Applicant: Applied Materials, Inc., Santa Clara, CA (US)

(72) Inventor: Kim Ramkumar Vellore, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 431 days.

(21) Appl. No.: 17/464,657

(22) Filed: Sep. 1, 2021

(65) Prior Publication Data

US 2023/0066087 A1    Mar. 2, 2023

(51) Int. Cl.
C30B 25/12       (2006.01)
C30B 25/10       (2006.01)
G01J 5/08        (2022.01)
H01L 21/687      (2006.01)

(52) U.S. Cl.
CPC .............. *C30B 25/12* (2013.01); *C30B 25/10* (2013.01); *G01J 5/08* (2013.01); *H01L 21/68757* (2013.01)

(58) Field of Classification Search
USPC ......................................................... 118/708
See application file for complete search history.

(56) References Cited

U.S. PATENT DOCUMENTS

| | | | |
|---|---|---|---|
| 4,996,942 A | 3/1991 | deBoer et al. | |
| 5,275,629 A | 1/1994 | Ajlka et al. | |
| 6,406,543 B1 | 6/2002 | Anderson | |
| 7,857,947 B2 * | 12/2010 | Ritchie | C23C 16/45565 204/192.15 |
| 7,976,634 B2 * | 7/2011 | Carlson | C23C 16/22 118/724 |
| 8,150,242 B2 * | 4/2012 | Merry | H01L 21/67248 392/407 |
| 8,663,390 B2 * | 3/2014 | Carlson | C23C 16/455 118/724 |
| 8,724,976 B2 * | 5/2014 | Merry | C23C 16/52 392/407 |
| 9,330,955 B2 * | 5/2016 | Behdjat | H01L 21/67115 |
| 9,842,759 B2 * | 12/2017 | Behdjat | C23C 16/50 |
| 10,056,286 B2 * | 8/2018 | Behdjat | H01L 21/67115 |
| 10,325,790 B2 * | 6/2019 | Peh | H05B 3/0047 |

(Continued)

OTHER PUBLICATIONS

Heraeus Black Quartz (HBQ®). (n.d.). Heraeus Black Quartz. Retrieved Dec. 1, 2021, from https://www.heraeus.com/en/hca/products_hca/hbq_black_quartz_hca.html.

(Continued)

*Primary Examiner* — Jethro M. Pence
(74) *Attorney, Agent, or Firm* — Patterson + Sheridan, LLP

(57) ABSTRACT

The present disclosure generally relates to a substrate support for processing of semiconductor substrates. In one example, the substrate support has a body. The body has a top surface configured to support a substrate thereon. The body has a bottom surface opposite the top surface. The body has an upper portion disposed at the top surface and a lower portion disposed at the bottom surface. An IR blocking material is encased by the upper portion and the lower portion, wherein the IR blocking material is an optically opaque at IR wavelengths and the lower portion is optically transparent at IR wavelengths.

20 Claims, 3 Drawing Sheets

(56) References Cited

U.S. PATENT DOCUMENTS

| | | | |
|---|---|---|---|
| 10,373,859 B2* | 8/2019 | Behdjat | H01L 21/67115 |
| 10,925,146 B1* | 2/2021 | Ryan | H05H 1/46 |
| 11,600,470 B2* | 3/2023 | Parimi | H01J 37/32651 |
| 2009/0238993 A1* | 9/2009 | Stowell | B05D 3/0227 |
| | | | 427/553 |
| 2010/0260589 A1 | 10/2010 | Hwang et al. | |
| 2013/0193132 A1 | 8/2013 | Serebryanov et al. | |
| 2014/0175054 A1* | 6/2014 | Carlson | C23C 16/22 |
| | | | 118/724 |
| 2014/0263268 A1 | 9/2014 | Cong et al. | |
| 2019/0309419 A1* | 10/2019 | Baluja | C23C 16/45536 |
| 2021/0005435 A1* | 1/2021 | Jung | H01J 37/32477 |
| 2023/0079651 A1* | 3/2023 | Khandan | C23C 16/4412 |
| | | | 118/725 |

OTHER PUBLICATIONS

Clear Fused Quartz. (n.d.). Clear Fused Quartz. Retrieved Dec. 1, 2021, from https://www.heraeus.com/en/hca/products_hca/clear_fused_quartz_hca.html.

International Search Report and Written Opinion for PCT/US2022/036976 dated Nov. 3, 2022.

Chinese Office Action for Application No. 202290000643.4 dated Aug. 13, 2024.

* cited by examiner

QUARTZ SUSCEPTOR FOR ACCURATE NON-CONTACT TEMPERATURE MEASUREMENT

BACKGROUND

Field

Embodiments of the present disclosure generally relate to apparatus and methods for fabricating semiconductor devices. More specifically, apparatus disclosed herein relate to an epitaxial deposition chamber having a susceptor.

Description of the Related Art

Semiconductor substrates are processed for a wide variety of applications, including the fabrication of integrated devices and micro devices. One such processing device is an epitaxial processing chamber. During processing, the substrate is positioned on a susceptor within the epitaxial processing chamber. The susceptor is supported by a support shaft, which is rotatable about a central axis. Precise control over a heating source, such as a plurality of heating lamps disposed below and above the substrate, allows the substrate to be heated within very strict tolerances. The temperature of the substrate can affect the uniformity of the material deposited on the substrate.

The ability to precisely control substrate temperatures within the epitaxial processing chamber has a significant impact throughput and production yields. Conventional epitaxial processing chamber have difficulty meeting temperature control criteria needed to fabricate next generation devices, while meeting ever increasing demands for improved production yields and faster throughput. Currently there is no reliable method to accurately determine the temperature of the substrate during annealing performed in an epitaxial processing chamber.

Therefore, a need exists for improved temperature control in epitaxial processing chambers.

SUMMARY

The present disclosure generally relates to a method for detecting a temperature of a substrate support and an apparatus for processing of semiconductor substrates. In one example, an apparatus for processing of semiconductor substrates is disclosed in the form of a substrate support. The substrate support has a body having a top surface configured to support a substrate thereon. The body has a bottom surface opposite the top surface. The body has an upper portion disposed adjacent and below the top surface and a lower portion disposed adjacent and above the bottom surface. An infrared (IR) blocking material is encased by the upper portion and the lower portion. The IR blocking material is optically opaque at IR wavelengths and the lower portion is optically transparent at IR wavelengths.

In another example, a semiconductor processing chamber is disclosed. The semiconductor processing chamber has a chamber body assembly. The chamber body assembly has a lower window and an upper window, wherein the lower window and the upper window enclose an internal volume. A plurality of temperature control elements are configured to heat the internal volume. A susceptor assembly is disposed in the internal volume. A lower pyrometer is disposed outside the internal chamber volume and configured detect a first temperature of the susceptor assembly. An upper pyrometer is disposed outside the internal chamber volume and configured to detect a second temperature of the susceptor assembly. The susceptor assembly has a shaft and a substrate support disposed on the shaft. The substrate support has a body. The body has a top surface configured to support a substrate thereon. The body has an IR transparent material and an IR blocking material encased in the body and having the IR transparent material disposed below the IR blocking material, wherein the IR blocking material is an optically opaque at IR wavelengths.

In another example, a method for detecting the temperature of a substrate support disposed in a semiconductor processing is disclosed. The method begins by rotating a substrate disposed on a substrate support, the substrate support disposed within a processing chamber. The method continues by scanning an IR blocking material disposed in the rotating substrate support disposed within a processing chamber with a pyrometer disposed outside the processing chamber, wherein the IR blocking material is disposed in an IR transmissive material of the substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a semiconductor processing chamber having a susceptor assembly configured to support a substrate during processing. The semiconductor processing chamber has a scanning pyrometer for accurately determining infrared (IR) radiation emitted from the substrate disposed on the susceptor assembly. The susceptor assembly uses a combination of quartz with an imbedded infrared blocking material to form a body having a fixed emissivity at various temperatures. The fixed (i.e., constant) emissivity of the blocking material disposed in the susceptor assembly enables non-contact measurement of IR radiation, i.e., substrate temperature, to be accurately determined. Advantageously, the disclosed susceptor allows for accurate temperature measurement of the substrate resulting in improved process uniformity, better yield and throughput, faster temperature control, process optimization and enhanced tool-to-tool process matching.

The semiconductor processing chamber is configured as a thermal deposition chamber or an annealing chamber, such as an epitaxial processing chamber. However, it should be appreciated that other processing chambers having a susceptor, heater, electrostatic chuck or other substrate support pedestal may benefit from the disclosed susceptor assembly when accurate temperature measurements are desired. For the sake of brevity, the susceptor assembly will be described in an epitaxial processing chamber. However, it should be understood that the teachings for the susceptor assembly in the epitaxial processing chamber are equally applicable to other processing chambers or systems for non-contact radiative heating.

Figure 1:
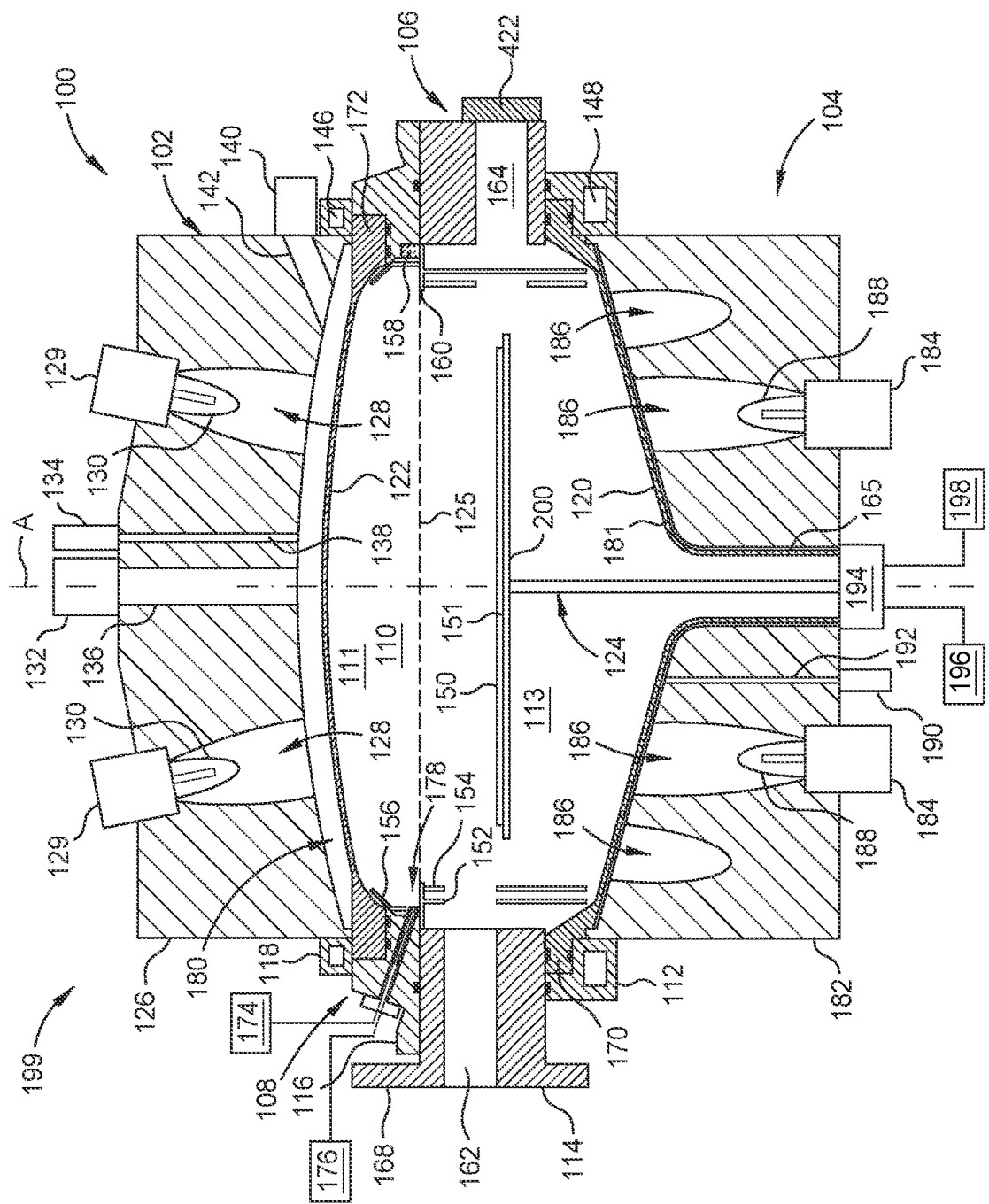
FIG. 1 is a schematic illustration of a semiconductor processing chamber having a susceptor assembly, according to embodiments of the present disclosure.

FIG. 1 is a schematic illustration of an epitaxial chamber 100, according to embodiments of the present disclosure. The epitaxial chamber 100 is an epitaxial deposition chamber and may be used as part of a cluster tool (not shown). The epitaxial chamber 100 is utilized to grow an epitaxial film on a substrate, such as substrate 150. Alternately, the epitaxial chamber 100 is utilized for etching.

The epitaxial chamber 100 includes a plurality of temperature control elements 199, a chamber body assembly 106, a susceptor assembly 124, a lower window 120, and an upper window 122. The upper window 122, the chamber body assembly 106 and the lower window 120 enclose an internal volume 110 of the epitaxial chamber 100. The plurality of temperature control elements 199 include lamp modules 101, an upper heater 158, a lower heater 152 and a heated gas passage 136. Additionally, the plurality may optionally include heating elements disposed within the susceptor assembly 124. Each of plurality of temperature control elements 199 can be utilized individually, or with one or more other plurality of temperature control elements 199 to control the temperature of the epitaxial chamber 100 while processing the substrate 150. The lamp modules 101 includes an upper lamp module 102 and a lower lamp module 104.

The susceptor assembly 124 is disposed in the internal volume 110 and configured to support the substrate 150 on a substrate support surface 151. The susceptor assembly 124 is disposed between the upper lamp module 102 and the lower lamp module 104. The lower window 120 is disposed between the susceptor assembly 124 and the lower lamp module 104. The upper window 122 is disposed between the susceptor assembly 124 and the upper lamp module 102.

The upper lamp module 102 is disposed over the susceptor assembly 124 and configured to heat the substrate 150 disposed on the susceptor assembly 124. The upper lamp module 102 includes an upper module body 126 and a plurality of lamp apertures 128 disposed through the upper module body 126. Each of the plurality of lamp apertures 128 includes a lamp base 129, or socket, in which a single lamp 130 is disposed therein. The orientation of the lamp 130 is generally defined by an imaginary line extending along a filament of the lamp 130 to the tip of the lamp 130. For example, the lamp 130 resting on its side on a surface has its imaginary line aligned with the filament and parallel to the surface. The orientation of the lamp 130 is also perpendicular to a chamber centerline CA' that extends vertically through the center of the upper lamp module. Alternately, the orientation of the lamp 130 is parallel to the chamber centerline CA'. Each of the lamps 130 are coupled to one of the lamp base 129. Each of the lamp bases 129 supports one of the lamps 130 and electrically couples each of the lamps 130 to a power source (not shown). Each of the lamps 130 are secured within the apertures 128.

The upper lamp module 102 further includes the heated gas passage 136 and a pyrometer passage 138. The heated gas passage 136 is fluidly coupled to a heated gas supply source 132. The heated gas passage 136 extends from the top surface to the bottom surface of the upper module body 126. The heated gas passage 136 is configured to allow heated gas, such as heated air or a heated inert gas, to flow from the heated gas supply source 132 to the top surface of the upper window 122 to convectively heat the upper window 122. Heating the upper window 122 enhances more of the lamps 130 energy is directed to the substrate 150 and not to heating the upper window 122.

The heated gas is supplied through the heated gas passage 136 to an upper plenum 180 defined between the upper lamp module 102 and the upper window 122. The heated gas passage 136 may be centrally disposed in the upper lamp module 102. The heated gas passage 136 may have a conical shape. Alternately, the heated gas passage 136 may have a frustoconical shape to promote outward flow into the upper plenum 180.

A heated gas exhaust passage 142 is also disposed through the upper module body 126. The heated gas exhaust passage 142 is coupled to a heated exhaust pump 140. The heated exhaust pump 140 removes gas from the upper plenum 180 through the heated gas exhaust passage 142. The heated exhaust pump 140 may also function as an exhaust pump for the process volume. The heated gas exhaust passage 142, in some embodiments, may be a groove or channel formed along an edge of the upper module body 126, or may be formed through or in a separate chamber component in fluid communication with the upper plenum 180.

The pyrometer passage 138 is disposed through the upper module body 126 to enable an upper pyrometer 134, such as a scanning pyrometer, to measure the temperature of the substrate 150. The upper pyrometer 134 is disposed on top of the upper module body 126 adjacent to the pyrometer passage 138. The pyrometer passage 138 extends from the top surface of the upper module body 126 to the bottom surface of the upper module body 126 that is adjacent to the upper window 122.

The lower lamp module 104 is disposed below the susceptor assembly 124 and is configured to heat a bottom side of the substrate 150 when the substrate is disposed on the susceptor assembly 124. The lower lamp module 104 includes a lower module body 182. A plurality of lamp apertures 186 are disposed through the lower module body 182. Each of the plurality of lamp apertures 186 has a lamp 188 disposed therein. Each lamp 188 is coupled to a lamp base 184. Each lamp base 184 supports a corresponding one of the lamps 188 and electrically couples the lamps 188 to a power source (not shown). The orientation of the lamps 188 is generally perpendicular to a vertical centerline of the epitaxial chamber 100. For example, the orientation of the lamps 188 is generally defined by an imaginary line extending through a filament to the tip of the lamp 188. The lamps 188 may be disposed in an orientation generally perpendicular to the substrate 150. Alternately, the orientation of the lamp 188 is parallel to the substrate 150.

The lower lamp module 104 further includes a susceptor shaft passage 195 and a pyrometer passage 192. The susceptor shaft passage 195 is disposed through the middle of the lower module body 182. A support shaft is disposed through the susceptor shaft passage 195 and coupled to the susceptor assembly 124. The susceptor shaft passage 195 is sized to allow the support shaft of the susceptor 124 to pass through the lower module body 182.

The pyrometer passage 192 is disposed through the lower module body 182 to enable a pyrometer 190, such as a scanning pyrometer, to measure the temperature of the bottom surface of the substrate 150 or the bottom surface of the substrate support. The lower pyrometer 190 is disposed below the lower module body 182, aligned with and adjacent to the pyrometer passage 192. The pyrometer passage 192 is disposed from the bottom surface of the lower module body 182 to the top surface of the lower module body 182 that is adjacent to the lower window 120.

The upper pyrometer 134 and lower pyrometer 190 provide accurate reading of the IR radiation emitted from the susceptor assembly 124. The emitted IR radiation from the susceptor assembly 124 is used to accurately determine the temperature of the substrate 150.

The chamber body assembly 106 includes an inject ring 116 and a base ring 114. The inject ring 116 is disposed on top of the base ring 114. The inject ring 116 includes one or more gas injectors 108 disposed therethrough. The base ring 114 includes a substrate transfer passage 162, one or more upper chamber exhaust passages, and a lower chamber exhaust passage 164. The substrate transfer passage 162 is disposed through the base ring 114 opposite the one or more upper chamber exhaust passages and the lower chamber exhaust passage 164. Each of the one or more upper chamber exhaust passages are disposed through base ring 114 and coupled to an exhaust module. The lower chamber exhaust passage 164 is also disposed through the base ring 114.

An upper chamber 111 is a portion of the internal volume 110 in which the substrate 150 is processed and process gases are injected through the gas injectors 108. The lower chamber 113 is a portion of the internal volume 110 in which the substrate 150 is loaded onto the susceptor assembly 124. The upper chamber 111 may also be described as the volume above substrate support surface 151 of the susceptor assembly 124 while the susceptor assembly 124 is in a processing position. The lower chamber 113 is the volume below the substrate support surface 151 of the susceptor assembly 124 while the susceptor assembly 124 is in the processing position. The processing position (not shown) is the position wherein the substrate 150 is disposed even with or above a horizontal reference plane 125. The horizontal reference plane 125 is a plane through which the inject ring 116 and the base ring 114 contact one another. The horizontal reference plane 125 is perpendicular to the vertical centerline of the epitaxial chamber 100.

The one or more upper chamber exhaust passages and the lower chamber exhaust passage 164 are coupled to one or more exhaust pumps (not shown). The one or more exhaust pumps are configured to remove exhaust gases from the internal volume 110 via the one or more upper chamber exhaust passages and the lower chamber exhaust passage 164. In some embodiments, each of the upper chamber exhaust passages and the lower chamber exhaust passage 164 are coupled to a single exhaust pump using a plurality of conduits. In another embodiment, the upper chamber exhaust passages are coupled to a different exhaust pump than the lower chamber exhaust passage 164.

The substrate transfer passage 162 is formed through the base ring 114. The substrate transfer passage 162 is configured to allow a substrate to pass therethrough from a transfer chamber of a cluster tool (not shown). A flange 168 is attached to one end of the base ring 114 to enable the attachment of the epitaxial chamber 100 to a cluster tool (not shown). The substrate transfer passage 162 passes through the flange 168.

An upper cooling ring 118 and a lower cooling ring 112 are disposed on opposite sides of the chamber body assembly 106. The upper cooling ring 118 is disposed on top of the inject ring 116 and is configured to cool the inject ring 116. The lower cooling ring 112 is disposed below the base ring 114 and is configured to cool the base ring 114. The upper cooling ring 118 includes a coolant passage 146 disposed therethrough. A coolant circulated through the coolant passage 146, may include water, oil or other suitable heat transfer fluid. The lower cooling ring 112 includes a coolant passage 148 disposed therethrough. A coolant circulated through the coolant passage 148 is similar to the coolant circulated through the coolant passage 146 of the upper cooling ring 118. In some embodiments, the upper cooling ring 118 and the lower cooling ring 112 assist in securing the inject ring 116 and the base ring 114 in the epitaxial chamber 100. The upper cooling ring 118 may partially support the upper lamp module 102 while the lower cooling ring 112 may partially support the base ring 114 and the inject ring 116.

The gas injectors 108 of the inject ring 116 are disposed through openings formed through the inject ring 116. In the example illustrated in FIG. 1, a plurality of gas injectors 108 are disposed through the inject ring 116. Each gas injector 108 is configured to supply process gases to the internal volume 110 via one or more gas outlets 178. For simplicity of discussion, a single gas injector 108 is shown in FIG. 1. The gas injector 108 is shown as being disposed at an acute angle relative the horizontal plane so the one or more gas outlets 178 are pointed downward toward the susceptor 124 and the substrate 150 residing below the gas injectors 108. Each of the gas injector 108 are fluidly coupled to one or more process gas supply sources, such as the first process gas supply source 174 or the second process gas supply source 176. In some embodiments, only a first process gas supply source 174 is utilized. In some embodiment in which both the first process gas supply source 174 and the second process gas supply source 176 are utilized, there are two gas outlets 178 within each gas injector 108. The two gas outlets 178 are formed in a single gas injector 108 and disposed in a stacked fashion to enable mixing of the gases only after the gases exit the gas injector 108 through the gas outlets 178 and enter the internal volume 110.

The upper window 122 is disposed between the inject ring 116 and the upper lamp module 102. The upper window 122 is an optically transparent window, such that radiant energy produced by the upper lamp module 102 passes therethrough. In some embodiments, the upper window 122 is formed of a quartz or a glass material. The upper window 122 has a dome shape and in some embodiments, is also called an upper dome. The outer edges of the upper window 122 form peripheral supports 172. The peripheral supports 172 are thicker than the central portion of the upper window 122. The peripheral supports 172 are disposed on top of the inject ring 116. The peripheral supports 172 connect to the central portion of the upper window 122 and are formed of the optically transparent material of the central portion of the upper window 122.

The lower window 120 is disposed between the base ring 114 and the lower lamp module 104. The lower window 120 is optically transparent, such that radiant energy produced by the lower lamp module 104 passes therethrough. In some embodiments, the lower window 120 is formed from a quartz or a glass material. The lower window 120 has a dome shape, and in some embodiments, is also called a lower dome. The outer edges of the lower window 120 form peripheral supports 170. The peripheral supports 170 are thicker than the central portion of the lower window 120. The peripheral supports 170 connect to the central portion of the lower window 120 and are formed of the same optically transparent material.

A variety of liners and heaters are disposed inside of the chamber body assembly 106 and within the internal volume 110. As shown in FIG. 1, an upper liner 156 and a lower liner 154 are disposed within the chamber body assembly 106. The upper liner 156 is disposed above the lower liner 154 and inward of the inject ring 116. The lower liner 154 is disposed inward of the base ring 114. The upper liner 156 and the lower liner 154 are coupled together while in the process volume. The upper liner 156 and the lower liner 154 shield the inner surfaces of the inject ring 116 and the base ring 114 from the process gases within the process volume. The upper liner 156 and the lower liner 154 further serve to reduce heat transfer from the process volume to the inject ring 116 and the base ring 114. Reduced heat transfer improves uniform heating of the substrate 150 and enables more uniform deposition on the substrate 150 during processing.

The lower chamber exhaust passage 164 is disposed across from the substrate transfer passage 162 and connects the lower chamber exhaust passage 164 with an exhaust pump (not shown). The exhaust pump may also be coupled to and be in fluid communication with both of the upper chamber exhaust passage openings.

The lower liner 154 is located inside of the opening of the base ring 114. The lower liner 154 has ring shaped and has a lower liner body. The lower liner 154 is configured to separate the inner surface of the base ring 114 from the internal volume 110. The upper liner 156 shields the inner surface of the base ring 114 from process gases within the internal volume 110 and further protects the internal volume 110 from particles or other contaminants released by the base ring 114 and the lower heater 152.

The upper heater 158 and the lower heater 152 are also disposed within the chamber body assembly 106 and the internal volume 110. The upper heater 158 is disposed between the upper liner 156 and the inject ring 116, while the lower heater 152 is disposed between the lower liner 154 and the base ring 114. Both of the upper heater 158 and the lower heater 152 are disposed inward of the chamber body assembly 106 to enable more uniform heating of the substrate 150 while the substrate 150 is within the epitaxial chamber 100. The upper heater 158 and the lower heater 152 reduce heat loss to the walls of the chamber body assembly 106 by heating the walls and preventing the walls from becoming a heat sink during processing. Thus, the upper heater 158 and the lower heater 152 create a more uniform temperature distribution around the surfaces forming the internal volume 110. Each of the upper liner 156, the lower liner 154, the upper heater 158, and the lower heater 152 is coupled to a flange 160 disposed within the internal volume 110. The flange 160 is a horizontal surface that is secured, e.g., clamped, between a portion of the inject ring 116 and the base ring 114 to secure each of the upper liner 156, the lower liner 154, the upper heater 158, and the lower heater 152. In embodiments described herein, the upper heater 158 may include any suitable heater such as a lamp, infrared heater, heat transfer fluid conduits or resistive heating elements among other types of heaters. The upper heater 158 is further shaped to accommodate openings through the inject ring 116 and the base ring 114. Similarly, the lower heater 152 may be similarly configured to the upper heater 158. The lower heater 152 is further shaped to accommodate openings through the inject ring 116 and the base ring 114.

The susceptor assembly 124 is disposed within the internal volume 110 and is configured to support the substrate 150 during processing. The susceptor assembly 124 includes a planar upper surface for supporting the substrate 150 and a shaft that extends through a portion of the lower window 120 and the lower lamp module 104. The susceptor assembly 124 is coupled by the shaft to a movement assembly 194. The movement assembly 194 includes a rotation assembly 196 and a lift assembly 198. The rotation assembly 196 is configured to rotate of the susceptor assembly 124 about a central axis A, while the lift assembly 198 is configured to move the susceptor assembly 124 linearly within the internal volume 110 along the central axis A. The central axis A is also the vertical centerline of the epitaxial chamber 100.

Figure 2:
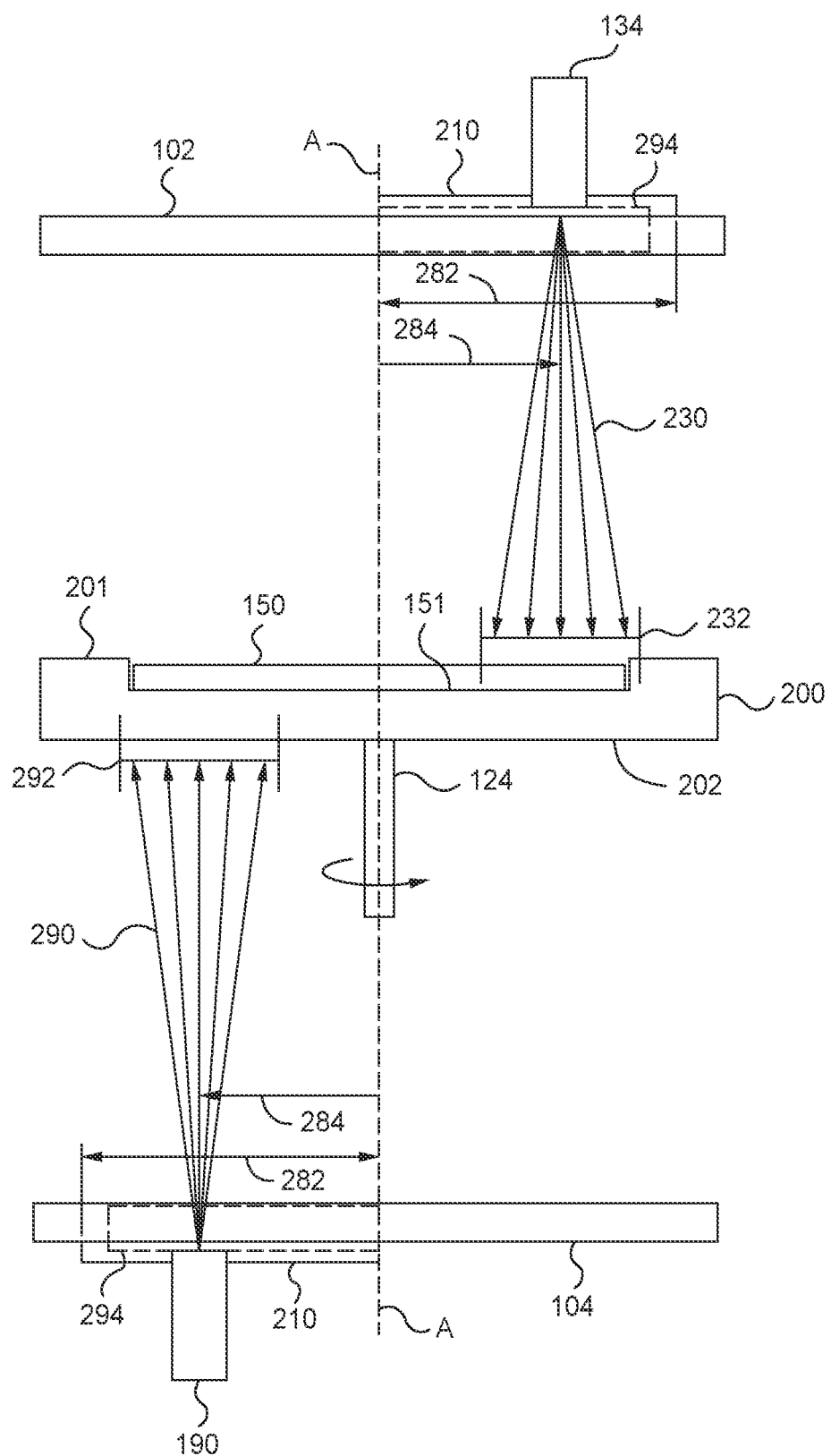
FIG. 2 is a schematic illustration of a pyrometer scanning of the susceptor assembly, according to embodiments of the present disclosure.

FIG. 2 is a schematic illustration of pyrometer scanning of a susceptor assembly 124, according to embodiments of the present disclosure. The susceptor assembly 124 includes a substrate support 200. The substrate support 200 has a top surface 201 and a bottom surface 202. One or more pyrometers are utilized to detect a temperature of the substrate support 200 and/or the substrate 150 disposed thereon the susceptor assembly 124. As discussed above, the epitaxial chamber 100 may have the upper pyrometer 134 disposed on, above or in the upper lamp module 102. In one or more examples, the epitaxial chamber 100 may additionally or alternatively have the lower pyrometer 190 disposed below, in or on the lower lamp module 104. The upper pyrometer 134 and lower pyrometer 190 may be of a narrow spectral band, such as a spectral band of IR, for example, centered between about 2.6 um and about 2.7 um, to avoid interference from the processing equipment and improve accuracy. In one example, the upper pyrometer 134 and lower pyrometer 190 read in a spectral band of about 2.7 um.

The upper pyrometer 134 is coupled to a movement mechanism 210. The movement mechanism 210 may be a rail or gimbal which moves the upper pyrometer 134 across a window 294. The window 294 is aligned with the pyrometer passage 138 of the upper module body 126. In one example, the movement mechanism 210 moves the upper pyrometer 134 in an X and Y direction relative to the window 294. In another example, the movement mechanism 210 moves the upper pyrometer 134 rotationally relative to at least one of the X and Y axes (e.g., the horizontal axes, with the Z axis extending in the vertical direction). The movement mechanism 210 steers the upper pyrometer 134 for collecting IR measurement along the substrate or any given upper part/component of the epitaxial chamber 100.

As the substrate 150 and substrate support 200 increase in temperature, they emit energy in the form of heat. The upper pyrometer 134 detects the emitted energy in the form of IR radiation emitted from the substrate 150 or substrate support 200 and uses the detected energy to determine the surface temperature of the substrate 150 or substrate support 200. To enhance the temperature across the substrate 150 or substrate support 200 can be determined, the upper pyrometer 134 is moveable by the movement mechanism 210 to scan the entire substrate 150 and/or substrate support 200. Stated differently, the movement mechanism 210 enables the upper pyrometer 134 to sample the IR radiation emitted from the substrate 150 or substrate support 200 at a plurality of locations so that the temperature profile across the surface of the substrate 150 and/or substrate support 200 may be determined, or mapped. With the movement provided by the movement mechanism 210, the upper pyrometer 134 can scan essentially the entire substrate 150 as the substrate 150 is rotated by the substrate support 200.

For example, the movement mechanism 210 is configured to more the upper pyrometer 134 radially outward from the center A of the epitaxial chamber 100 a distance 282. The upper pyrometer 134 has a line of sight for detecting IR radiation emitted from the substrate 150 or substrate support 200. The movement mechanism 210 moves the line of sight 230 for the upper pyrometer 134 a first distance 284 to detect an area 232 on the substrate 150 and top surface 201 of the substrate support 200. The upper pyrometer 134 is able to detect the IR radiation emitted from the substrate 150 and susceptor assembly 124 that passes through the detection area 232 as the susceptor assembly 124 is rotated. In this manner, the upper pyrometer 134 can determine the temperature across the top surface 201 of the substrate support 200 as well as the temperature across the substrate 150. The temperatures may be recorded as a temperature map for providing the location on the substrate associated with each temperature reading.

Similar to the upper pyrometer 134, the lower pyrometer 190 is coupled to a second movement mechanism 210. The movement mechanism 210 may be a rail or gimbal which moves the lower pyrometer 190 across a window 294. The window 294 is disposed in the pyrometer passage 192 of the lower module body 182. In one example, the second movement mechanism 210 moves the lower pyrometer 190 in an X and Y direction relative to the window 294. In another example, the second movement mechanism 210 moves the lower pyrometer 190 rotationally relative to at least one of the X and Y axes. With the movement provided by the movement mechanism 210, the lower pyrometer 190 can scan essentially the entire substrate support 200 as the substrate support 200 is rotated. The movement mechanism 210 steers the lower pyrometer 190 for collecting IR measurement along any given lower part/component of the epitaxial chamber 100.

The lower pyrometer 190 detects the emitted energy in the form of IR radiation emitted from the substrate support 200 to determine the surface temperature of the substrate support 200. To enhance the temperature across the substrate support 200 can be detected, the lower pyrometer 190 is moveable by the movement mechanism 210 to scan the entire substrate support 200 as the substrate support 200 is rotated.

For example, the lower pyrometer 190 may move a first distance 284 radially outward from the center A of the epitaxial chamber 100. The movement mechanism 210 moves a line of sight 290 for the upper pyrometer 134 the first distance 284 to detect an area 292 on the bottom surface 202 of the substrate support 200. The lower pyrometer 190 is able to detect the IR radiation emitted from the substrate support 200 that passes through the detected area 292 as the susceptor assembly 124 is rotated. In this manner, the lower pyrometer 190 can determine the temperature across the entire the substrate support 200. The temperatures may be recorded as a temperature map for providing the location of each temperature reading.

The substrate support 200 is configured to accurately enable temperature readings by the upper and lower pyrometer 134, 190. The substrate support 200 includes an IR blocking layer encased in an IR transparent material. The material of the IR blocking layer is selected to provide a fixed emissivity at various temperatures so that IR radiation can be read accurately over a wide temperature range. The IR blocking layer may be a metal layer, such as transition metal or post transition metal. For example, the IR blocking layer may be formed from platinum. However, it should be appreciated that the IR blocking material may be any suitable could be non-metallic material which blocks one wavelength or the IR spectrum such as a ceramic, or dichroic reflective IR coating. The IR transparent material of the substrate support 200 may be formed from one or more layers of quartz with low OH (oxygen/hydrogen) content making the IR transparent material portion of the substrate support 200 transparent at IR spectrum. When the substrate support 200 is heated, the temperature of the substrate support 200 can be accurately determined by the pyrometer as the emissivity does not change with variation in temperature. The substrate temperature can be determined accurately even with varying emissivity because of the measured temperature from the IR blocking material in the substrate support 200 may be used to infer or calculate a substrate temperature.

Figure 3:
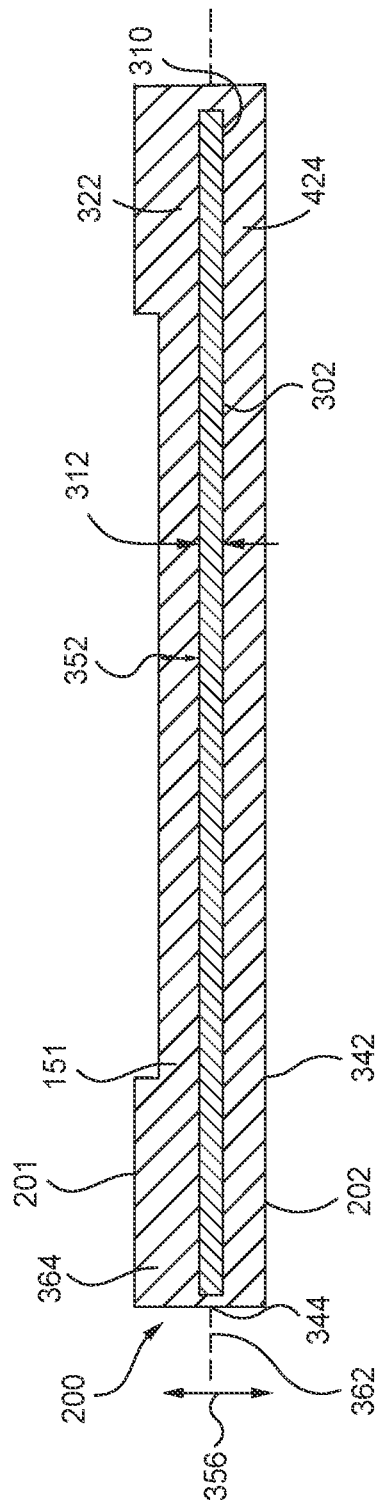
FIG. 3 is a schematic illustration of one example of the susceptor assembly of FIG. 2.

FIG. 3 is a schematic illustration of a first embodiment of the substrate support 200 of FIG. 2. The substrate support 200, having the top surface 201 and the bottom surface 202, has a body 302 formed from an IR transmissive material. The body 302 has an upper portion 322 and a lower portion 342. The substrate support 200 may have an overall thickness 356 between the top surface 201 and the bottom surface 202 of between 3 mm and about 1.5 mm, such as about 2 mm. The upper portion 322 has a lower surface 362, and the lower portion 342 has an upper surface 344. The IR transmissive material of the body 302 has an IR blocking material 310 disposed therein. The IR blocking material 310 disposed in the body 302 may be in the form of a layer of metal or other IR blocking material. The IR blocking material 310 is spaced from the substrate support surface 151 (e.g. top surface 201) of the body 302 by at least a distance 352. The distance 352 is selected may enhance manufacturability reduced defects, and may be between about 0.3 mm and about 0.5 mm.

The IR blocking material 310 is sandwiched between the upper portion 322 and the lower portion 342 of the IR transparent material comprising the body 302. In one example, the IR blocking material 310 is completely surrounded by, or encased by, the IR transparent material of the upper portion 322 and/or the lower portion 342. The upper portion 322 and lower portion 342 may be formed together monolithically to encase the IR blocking material 310. For example, the IR blocking material 310 may be placed in the body 302 prior to sintering. Alternately, the IR blocking material 310 may be 3D printed inside the body 302 while 3D printing the body 302. In yet another example, the IR blocking material 310 extends to an outer periphery of the substrate support 200 and separates the upper portion 322 of the body 302 from the lower portion 342 of the body 302 where the upper and lower portions 322, 342 are discrete separate layers.

The IR blocking material 310 is a continuous coating, film, layer or plate such that it is continuous without holes or voids to enable more accurate detection by the pyrometers. A continuous layer for the IR blocking material 310 may provide uniformity and ease of reading but the IR blocking material 310 can also have a pattern for other reasons and the data for the emissivity can be interpolated. The IR blocking material 310 is electrically isolated, i.e., not electrically coupled directly or by a switch to other electrical circuitry of the processing chamber such that the IR blocking material is floating. That is, the IR blocking material 310 is not a heater, electrode or ground, or part of another electrical circuit disposed in the substrate support 200. It should be appreciated that the IR blocking material 310 has properties that enable accurate temperature measurement of the substrate support 200 by the pyrometers 124/190. For example, the IR blocking material 310 has a fixed emissivity across various temperatures.

The IR blocking material 310 may be an embedded infrared blocking material. The IR blocking material 310 may be a dichroic reflective IR coating. The IR blocking material 310 may be between about 2 microns to about 3 microns thick. The IR blocking material 310 may be formed from platinum, stainless steel, molybdenum, aluminum, copper, alloys thereof or any other suitable metal having emissivity suitable for measuring temperature. Although the IR blocking material 310 is illustrated as a single layer of material, there may be second layer of the IR blocking material. For example, a heater or chucking mesh may be disposed between a first layer of IR blocking material and a second layer of IR blocking material where there is a need to read the temperature from both above and below the substrate support 200.

The upper portion 322 may be formed from a material similar in characteristics to the material forming the lower portion 342. In one example, the upper portion 322 and lower portion 342 may be formed from the same material. The upper portion 322 and lower portion 342 of the body 302 may be formed from a material having emissivity which is optically transparent at IR wavelengths. In one example, the upper portion 322 and lower portion 342 of the body 302 may be formed from a synthetic quartz having a low oh content, such as one using chemical gases as raw material. The chemical gas contains a silicon source put into reaction with oxygen forming pure silicon dioxide. The purity achievable by this manufacturing procedure is magnitudes higher compared to natural quartz. Electric fusion or flame fusion may be used for melting the IR transparent material during manufacturing. Electric fusion is the most commonly used melting process for manufacturing quartz glass. Alternately, flame fusion does not use an electric current, but uses an $H_2/O_2$-Flame to heat up and melt the IR transparent material. The flame fused quartz has an extremely low bubble content. In one example the body 302 is formed from flame fused quartz. The IR transparent quartz material of the body 302 may have a thermal expansion (20-200° C.) of between about 0.4 7 $K^{-1}$ and about 10-6 $K^{-1}$. The IR transparent quartz material of the body 302 may have a thermal conductivity (20° C.) of about 1.49 $W·m^{-1}·K^{-1}$. The IR transparent quartz material of the body 302 may have a maximum working temperature of about 1110° C. (long exposure duration)/1250° C. (short exposure duration). The IR transparent quartz material of the body 302 is extremely transparent in the IR spectrum, for example, between wavelengths of about 2.6 um and about 2.7 um, i.e., in the same range as the pyrometers.

The IR transparent quartz of the upper portion 322 and lower portion 342 encases the IR blocking material 310. The arrangement of the transparent quartz encasing the embedded infrared blocking material, i.e., IR blocking material 310, provides the substrate support 200 with fixed emissivity at various temperatures that allows IR radiation to be read accurately over a wide temperature range. For example, the body 302 is optically transparent through the lower portion 342 such that the pyrometer 190 may accurately read the emissions from the IR blocking material 310 to get a bottom temperature of the substrate support 200, which is indicate of the temperature of the substrate 150 disposed on the body 302. Similarly, the body 302 is optically transparent through the upper portion 322 such that the pyrometer 134 may accurately read the emissions from the IR blocking material 310 to get a top temperature of the substrate support 200. As the substrate 150 is transparent to the pyrometer, accurate reading of the temperature of the substrate support 200 is utilized to infer the temperature of the substrate 150. The substrate support 200 advantageously allows for greater temperature reading accuracy from both the top surface 201 and the bottom surface 202 of the substrate support 200 for improved substrate processing performance.

Figure 4:
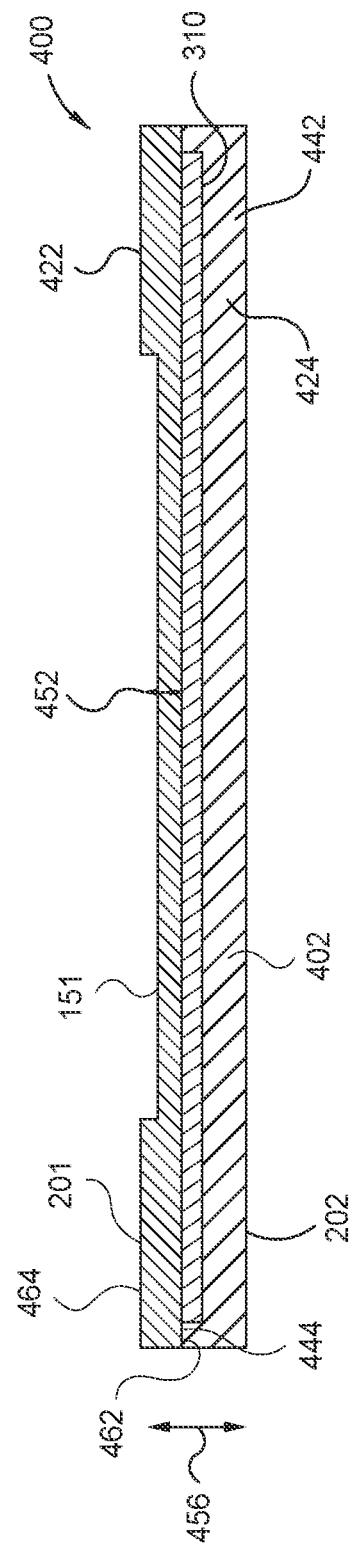
FIG. 4 is a schematic illustration of another example of the susceptor assembly of FIG. 2.

FIG. 4 is a schematic illustration for a second embodiment of a substrate support 400. The substrate support 400 may be utilized in place of the substrate support 200 of FIG. 2. Similar to the substrate support 200, the substrate support 400 has a top surface 201 and a bottom surface 202. The substrate support 400 has a body 402. The body 402 is formed an IR transparent material. The body 402 has an upper portion 422 and a lower portion 442. The body 402 additionally has a IR blocking material 310 disposed therein the body 302.

The substrate support 400 may have an overall thickness 456 between the top surface 201 and the bottom surface 202 of between 3 mm and about 1.5 mm such as about 2 mm. The upper portion 422 has a lower surface 462 and the lower portion 442 has an upper surface 444. The IR blocking material 310 is space from the substrate support surface 151 of the body 402 by a distance 452. The distance 452 is selected enhance manufacturability reduced defects, and may be between about 0.3 mm and about 0.5 mm.

The IR blocking material 310 is sandwiched between the upper portion 422 and the lower portion 442. In one example, the IR blocking material 310 is completely surrounded by the upper portion 422 and/or the lower portion 442. In another example, the IR blocking material 310 extends to an outer periphery of the substrate support 400 and separates the upper portion 422 of the body 402 from the lower portion 442 of the body 402. The IR blocking material 310 has a fixed (i.e., constant) emissivity at various temperatures. The IR blocking material 310 is substantially the same as described above with respect to FIG. 3.

The lower portion 442 may be formed from a material having different characteristics to the material forming the upper portion 422. In one example, the lower portion 442 and upper portion 422 are formed from different materials. The lower portion 442 may be formed from a material having emissivity which is optically transparent. In one example, the lower portion 442 of the body 402 may be formed from a synthetic quartz such as described above with respect to lower portion 342.

The upper portion 422 may be formed from a material having high optical absorption. For example, the upper portion 422 having a thickness as little as 3 mm may have over 95% absorption in a wide range of wavelengths from ultra violet to the middle wavelength infrared. Additionally, at a thickness of just 1 mm the material of the upper portion 422 provides 80% or more absorption in a wide range of wavelengths from ultra violet to the middle wavelength infrared.

The upper portion 422 may be formed from a doped quartz, silica doped quartz darkened to absorbed IR heat faster, ceramic materials like SiC, AlN or other opaque high purity quartz glass composite such as a silicon dioxide (fused quartz) with silicon. The material of the upper portion 422 may be selected to provide high emissivity. The upper portion 422 may have values for emissivity close to a black body emitter at elevated temperatures. For example, the material of the upper portion 422 may emit as much or more thermal radiative energy as any other body at the same temperature. The upper portion 422 may have emissivity of 80% or more over a wide range of wavelengths, i.e., reaching 95% emissivity at wavelengths between 2.6 µm and 2.7 µm.

The material of the upper portion 422 may have a thermal expansion (at 20-200° C.) of about 0.57×10-6 K$^{-1}$. The material of the upper portion 422 may have a thermal conductivity (at 20° C.) of about 1.49 W·m-1·K$^{-1}$. The maximum working temperature for the material of the upper portion 422 may be about 1160° C. (long exposure duration)/1300° C. (short exposure duration). The emissivity for the material of the upper portion 422 at about 1000° C. may be between about 80% and about 90%. The material of the upper portion 422 advantageously provides faster heating of the substrate support 400 from the top of the processing chamber.

Advantageously, the substrate supports described herein provide a constant emissivity that enables non-contact temperature measurement in the IR wavelength range for the substrate which changes with temperature. The combination for IR transparent material encasing an IR blocking material provides a susceptor with fixed emissivity over various temperatures that allows IR radiation emitted from the IR blocking material, which is indicate of the temperature of the substrate, to be accurately read. Thus, the substrate support enables the temperature of the substrate supported thereon to be accurately determined. The rotational substrate support and motion controlled pyrometers also enables scanning of the IR blocking material disposed in the substrate support so that temperatures across the entire substrate may be determined. The accurate temperature measurement across the entire substrate allows greater processing uniformity and deposition control within processing chambers, such as epitaxial and anneal chambers.

While the foregoing is directed to embodiments of the present disclosure, other and further embodiments of the disclosure may be devised without departing from the basic scope thereof, and the scope thereof is determined by the claims that follow.

What is claimed is:

1. A substrate support comprising:
    a body comprising:
        a top surface configured to support a substrate thereon;
        a bottom surface opposite the top surface;
        an upper portion disposed at the top surface;
        a lower portion disposed at the bottom surface; and
        an infrared (IR) blocking material encased by the upper portion and the lower portion, wherein the IR blocking material is optically opaque at infrared (IR) wavelengths and the lower portion is optically transparent at IR wavelengths.

2. The substrate support of claim 1, wherein the IR blocking material is a dichroic reflective infrared (IR) coating.

3. The substrate support of claim 1, wherein the IR blocking material is formed from platinum foil.

4. The substrate support of claim 1, wherein the lower portion is formed from quartz having a low oxygen/hydrogen content.

5. The substrate support of claim 4, wherein the lower portion is optically transparent at IR wavelengths between 2.6 um and 2.7 um.

6. The substrate support of claim 1, wherein the upper portion is formed of quartz with low oxygen/hydrogen content.

7. The substrate support of claim 6, wherein the upper portion is optically transparent at IR wavelengths between 2.6 um and 2.7 um.

8. The substrate support of claim 1, wherein the upper portion is formed from a darkened doped quartz.

9. The substrate support of claim 8, wherein the upper portion has values for emissivity close to a black body emitter at elevated temperatures.

10. A processing chamber comprising:
    a chamber body assembly;
    a lower window;
    an upper window, wherein the lower window and the upper window are on opposite sides of an internal chamber volume;
    a plurality of temperature control elements configured to heat a substrate disposed in the internal chamber volume;
    a susceptor assembly disposed in the internal chamber volume; and
    a lower pyrometer disposed outside the internal chamber volume and configured detect a first temperature of the susceptor assembly through the lower window; and
    an upper pyrometer disposed outside the internal chamber volume and configured to detect a second temperature of the susceptor assembly through the upper window, wherein the susceptor assembly comprises:
        a shaft;
        a substrate support disposed on the shaft, the substrate support comprising:
        a body having a top surface configured to support a substrate thereon, a bottom surface opposite the top surface, an upper portion disposed at the top surface, and a lower portion disposed at the bottom surface, wherein the body comprising:
            an infrared (IR) transparent material; and
            an infrared (IR) blocking material encased by the upper portion and the lower portion, wherein the IR blocking material is optically opaque at infrared (IR) wavelengths, the IR transparent material disposed below the IR blocking material in the lower portion and is optically transparent at IR wavelengths.

11. The processing chamber of claim 10, wherein the IR blocking material is dichroic reflective infrared (IR) coating.

12. The processing chamber of claim 10, wherein the IR blocking material is formed from platinum foil.

13. The processing chamber of claim 10, wherein the IR transparent material is formed of quartz having a low oxygen/hydrogen content and is optically transparent at IR wavelengths between 2.6 um and 2.7 um.

14. The processing chamber of claim 13, wherein the IR transparent material is additionally disposed above the IR blocking material.

15. The processing chamber of claim 10, wherein the susceptor assembly is configured to rotate the substrate; and one or both of the lower and upper pyrometers is movable to scan the rotating substrate.

16. The processing chamber of claim 10 further comprising:
    a motion controller coupled to the lower pyrometer and configured to move the lower pyrometer in a manner that scans the IR blocking material.

17. The processing chamber of claim 10, the body further comprising:
    a darkened doped quartz material disposed above the IR blocking material.

18. The processing chamber of claim 17, wherein the darkened doped quartz material has values for emissivity close to that of a black body emitter at elevated temperatures.

19. The processing chamber of claim 10, wherein the lower pyrometer is configured to detect infrared (IR) radiation emitted from the IR blocking material.

20. A method for detect a temperature of a substrate support, the method comprising:
- rotating a substrate disposed on a substrate support, the substrate support disposed within a processing chamber, wherein the substrate support comprises:
- a body comprising:
  - a top surface configured to support the substrate thereon;
  - a bottom surface opposite the top surface;
  - an upper portion disposed at the top surface;
  - a lower portion disposed at the bottom surface; and
  - an infrared (IR) blocking material encased by the upper portion and the lower portion, wherein the IR blocking material is optically opaque at infrared (IR) wavelengths and the lower portion is optically transparent at IR wavelengths; and
- scanning the IR blocking material disposed in the rotating substrate support disposed within the processing chamber with a pyrometer.

* * * * *